United States Patent
Calabrò

(10) Patent No.: US 11,139,834 B2
(45) Date of Patent: Oct. 5, 2021

(54) DECODER FOR A FAMILY OF RATE COMPATIBLE LOW-DENSITY PARITY CHECK (LDPC) CODES

(71) Applicant: Xieon Networks S.a.r.l., Luxembourg (LU)

(72) Inventor: Stefano Calabrò, Munich (DE)

(73) Assignee: XIEON NETWORKS S.a.r.l., Luxembourg (LU)

( * ) Notice: Subject to any disclaimer, the term of this patent is extended or adjusted under 35 U.S.C. 154(b) by 0 days.

(21) Appl. No.: 16/092,813

(22) PCT Filed: Apr. 13, 2017

(86) PCT No.: PCT/EP2017/058904
§ 371 (c)(1),
(2) Date: Oct. 11, 2018

(87) PCT Pub. No.: WO2017/178578
PCT Pub. Date: Oct. 19, 2017

(65) Prior Publication Data
US 2019/0140661 A1    May 9, 2019

(30) Foreign Application Priority Data

Apr. 14, 2016 (EP) .................................... 16165411

(51) Int. Cl.
*H03M 13/11* (2006.01)
*H03M 13/00* (2006.01)

(52) U.S. Cl.
CPC ...... *H03M 13/1137* (2013.01); *H03M 13/114* (2013.01); *H03M 13/116* (2013.01); *H03M 13/1148* (2013.01); *H03M 13/6393* (2013.01)

(58) Field of Classification Search
CPC ........... H03M 13/1137; H03M 13/116; H03M 13/114; H03M 13/6393; H03M 13/1148
See application file for complete search history.

(56) References Cited

U.S. PATENT DOCUMENTS

| | | | | |
|---|---|---|---|---|
| 2008/0263425 A1* | 10/2008 | Lakkis | ............... | H03M 13/1105 714/752 |
| 2010/0174963 A1* | 7/2010 | Kienle | ............... | H03M 13/1165 714/752 |
| 2011/0307756 A1* | 12/2011 | Nguyen | ............... | H03M 13/036 714/752 |

OTHER PUBLICATIONS

Dholakia, A. et al., "Rate-compatible low-density parity-check codes for digital subscriber lines," Proc., IEEE International Conference on Communications, ICC 2004, Paris,,vol. 1: 415-419 (Jun. 2004).

(Continued)

*Primary Examiner* — Thien Nguyen (57) ABSTRACT

Disclosed herein is a decoder 10 for decoding a family of L rate compatible parity check codes, said family of parity check codes comprising a first code that can be represented by a bipartite graph having variable nodes, check nodes, and edges, and L−1 codes of increasingly lower code rate, among which the i-th code can be represented by a bipartite graph corresponding to the bipartite graph representing the (i−1)-th code, to which an equal number of $n_i$ variable nodes and check nodes are added, wherein the added check nodes are connected via edges with selected ones of the variable nodes included in said i-th code, while the added variable nodes are connected via edges with selected added check nodes only. The decoder comprising L check node processing units 14, among which the i-th check node processing unit processes only the check nodes added in the i-th code over the (i−1)-th code, wherein said L check node processing units 14 are configured to operate in parallel.

19 Claims, 3 Drawing Sheets

(56) References Cited

OTHER PUBLICATIONS

Fossorier, M. et al., "Quasi-Cyclic Low-Density Parity-Check Codes From Circulant Permutation Matrices," IEEE Transactions on Information Theory, vol. 50(8):1788-1793 (2004).
Gho, G-H. et al., "Rate-adaptive modulation and low-density parity-check coding for optical fiber transmission systems," Journal of Optical Communications and Networking, Optical Society of America, vol. 4:760-768 (2012).
Hagenauer, J. "Rate-compatible punctured convolutional codes (RCPC codes) and their applications", IEEE Transactions on Communications, vol. 36(4): 389-400, Apr. 1988.
Hagenauer, J. et al., "Iterative decoding of binary block and convolutional codes," IEEE Transactions on Information Theory, vol. 42:429-445 (1996).
Hocevar, D.E. et al., "A reduced complexity decoder architecture via layered decoding of LDPC codes," Proceedings of the IEEE Workshop on Signal Processing Systems (SIPS), pp. 107-112, 2004.
Hu, X-Y, et al., "Efficient implementations of the sum-product algorithm for decoding LDPC codes," IEEE Global Telecommunications Conference, GLOBECOM '01, 2001.
International Search Report and Written Opinion, PCT/EP2017/058904, dated Jun. 28, 2017, 18 pages.
Li, J. et al., "Rate-Compatible Low Density Parity Check Codes for Capacity-Approaching ARQ Schemes in Packet Data Communications," Proc., ISATED International Conference on Communications, Internet, and Information Technology, St. Thomas, US Virgin Islands, Acta Press, Anaheim, CA, USA, Nov. 18, 2002 (Nov. 18, 2002),—Nov. 20, 2002 (Nov. 20, 2002), pp. 201-206.
Mansour, M. et al., "High-throughput LDPC decoders," IEEE Transactions on Very Large Scale Integration (VLSI) Systems, vol. 11(6): 976-996, Dec. 2003.
Nguyen, T-V. et al., "The Design of Rate-Compatible Protograph LDPC codes," Proc., IEEE 48th Annual Allerton Conference on Communication, Control, and Computing, Monticello, Illinois, USA, Sep. 29, 2010 (Sep. 29, 2010), Oct. 1, 2010 (Oct. 1, 2010), pp. 1-5.
Nguyen, T-V. et al., "The Design of Rate-Compatible Protograph LDPC Codes," IEEE Transactions on Communications, vol. 60(10):2841-2850, Oct. 2012.
Richardson, T. et al., "Design of Capacity-Approaching Irregular Low-Density Parity-Check Codes," IEEE Transactions on Information Theory, vol. 47(2): 619-637 (2001).
Richardson, T. et al., "The capacity of low-density parity-check codes under message-passing decoding," IEEE Transactions on Information Theory, vol. 47: 599-618 (2001).
Thorpe, J. "Low-Density Parity-Check (LDPC) Codes Constructed from Protographs", IPN Progress Report, 42-154 (2003).
Vasic, B. et al., "Low-density parity check codes for long-haul optical communication systems," IEEE Photonics Technology Letters, vol. 14: 1208-1210 (2002).
Yeo, E. et al., "High-throughput low-density parity-check decoder architectures," Proceedings 2001 Global Conference on Communications, San Antonio, TX, pp. 3019-3024, Nov. 2001.
Zhang, J. et al., "Shuffled belief propagation decoding," Conference record Thirty-Sixth Asilomar Conference on Signals, Systems and Computers, pp. 8-15, 2002.
Zhang, K. et al., "High-Throughput Layered Decoder Implementation for Quasi-Cyclic LDPC codes," IEEE Journal on Selected Areas in Communications, IEEE Service Center, Piscataway, US, vol. 27(6):985-994.

\* cited by examiner

Fig. 1

| | | | | | | | | | | | | |
|---|---|---|---|---|---|---|---|---|---|---|---|---|
| Band 1 | 0 | $\pi_{0,1}$ | $\pi_{0,2}$ | $\pi_{0,3}$ | $\pi_{0,4}$ | $\pi_{0,5}$ | $\pi_{0,6}$ | 0 | 0 | | | 0 |
| | $\pi_{1,0}$ | $\pi_{1,1}$ | $\pi_{1,2}$ | 0 | $\pi_{1,4}$ | $\pi_{1,5}$ | $\pi_{1,6}$ | | | | | |
| | $\pi_{2,0}$ | $\pi_{2,1}$ | $\pi_{2,2}$ | $\pi_{2,3}$ | $\pi_{2,4}$ | $\pi_{2,5}$ | 0 | | | | | |
| Band 2 | 0 | $\pi_{3,1}$ | $\pi_{3,2}$ | 0 | $\pi_{3,4}$ | 0 | $\pi_{3,6}$ | $\pi_{3,7}$ | 0 | | | |
| | $\pi_{4,0}$ | 0 | $\pi_{4,2}$ | $\pi_{4,3}$ | 0 | $\pi_{4,5}$ | 0 | $\pi_{4,7}$ | $\pi_{4,8}$ | | | |
| Band 3 | 0 | 0 | $\pi_{5,2}$ | 0 | 0 | 0 | $\pi_{5,6}$ | 0 | 0 | $\pi_{5,9}$ | 0 | 0 |
| | $\pi_{6,0}$ | 0 | 0 | $\pi_{6,3}$ | 0 | 0 | 0 | $\pi_{6,7}$ | $\pi_{6,8}$ | 0 | $\pi_{6,10}$ | 0 |
| | 0 | 0 | $\pi_{7,2}$ | 0 | 0 | $\pi_{7,5}$ | 0 | 0 | 0 | $\pi_{7,9}$ | 0 | $\pi_{7,11}$ |
| B.4 | 0 | 0 | $\pi_{8,2}$ | 0 | 0 | 0 | 0 | $\pi_{8,7}$ | 0 | 0 | 0 | $\pi_{8,12}$ |

Fig. 2

| $l$ | $m_l$ | $N_{4,l}$ | $p_l$ | Total number of rounds |
|---|---|---|---|---|
| 1 | 3 | 20 | 1 | 60 |
| 2 | 2 | 30 | 1 | 60 |
| 3 | 3 | 20 | 1 | 60 |
| 4 | 1 | 60 | 1 | 60 |

Fig. 3

| $l$ | $m_l$ | $N_{4,l}$ | $p_l$ | Total number of rounds |
|---|---|---|---|---|
| 1 | 3 | 20 | 2 | 120 |
| 2 | 2 | 20 | 3 | 120 |
| 3 | 3 | 20 | 2 | 120 |
| 4 | 1 | 20 | 6 | 120 |

Fig. 4

| Round | $CNP_1$ | $CNP_2$ | $CNP_3$ | $CNP_4$ |
|---|---|---|---|---|
| 1 | 0 | 3 | 5 | 8 |
| 2 | 0 | 3 | 5 | 8 |
| 3 | 1 | 3 | 6 | 8 |
| 4 | 1 | 4 | 6 | 8 |
| 5 | 2 | 4 | 7 | 8 |
| 6 | 2 | 4 | 7 | 8 |

DECODER FOR A FAMILY OF RATE COMPATIBLE LOW-DENSITY PARITY CHECK (LDPC) CODES

RELATED APPLICATIONS

This application is a 35 U.S.C. 371 national stage filing of International Application No. PCT/EP2017/058904, filed on Apr. 13, 2017, which claims priority to European Patent Application No. 16165411.6, filed on Apr. 14, 2016. The entire contents of these applications are incorporated herein by reference in their entirety.

FIELD OF THE INVENTION

The present invention is in the field of coding and decoding of digital data. In particular, the present invention relates to a decoder for decoding a family of rate compatible parity check codes, and a corresponding decoding method.

BACKGROUND OF THE INVENTION

Low-density parity-check (LDPC) codes, introduced by R. G. Gallager in "*Low-Density Parity-Check Codes*", MIT Press, Cambridge, Mass. in 1963, are linear codes with a sparse parity check matrix. They proved to attain excellent performance at manageable complexity practically in all communication fields and have been considered also for applications in fiber optic communications, as described in B. Vasic and I. B. Djordjevic, "*Low-density parity check codes for long-haul optical communication systems*", IEEE Photonics Technology Letters, vol. 14, pp. 1208-1210, 2002.

Figure 1:
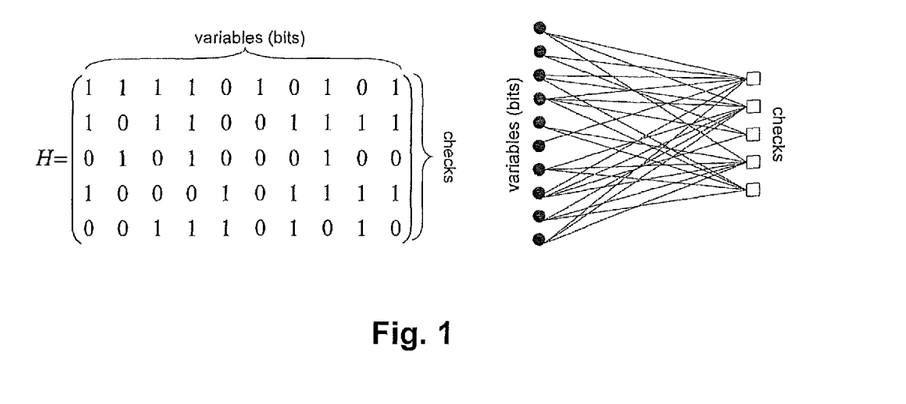
FIG. 1 shows an adjacency matrix and a bipartite graph of a low-density parity check code which is represented by the adjacency matrix.

A LDPC code can be represented by a sparse bipartite graph, whose left and right nodes correspond conventionally to the code variables (bits) and check equations, respectively. Each of the check nodes is connected to two or more variable nodes by corresponding edges. The parity check matrix is the adjacency matrix of the bipartite graph. Note that in the present disclosure, the terms "adjacency matrix" and "parity check matrix" are used synonymously. FIG. 1 illustrates the relationship between parity check matrix (adjacency matrix) and bipartite graph for a very simple code. As is seen in FIG. 1, the columns of the adjacency matrix represents the variable nodes, the rows represent check nodes, and an entry of "1" represents an edge connecting the variable node and the check node of the corresponding column and row, respectively.

LDPC codes can be conveniently decoded by belief propagation (BP): Nodes exchange messages iteratively along the edges of the bipartite graph. Both the messages from a variable v to a check c and the message from c to v represent the probability that v is 0 or 1 given the channel value and the knowledge of certain messages passed in the previous decoding round. The "channel value" can be any physical quantity of the transmitted signal that represents the bit value, such as e.g. a voltage that may in a simple example be above a certain threshold to represent a "1" and below a certain threshold to represent a "0". A channel value (voltage) that is above but close to such threshold would indicate a lesser probability that the variable is indeed a "1", while a voltage clearly above the threshold would indicate a higher probability of this.

While BP is less powerful than e.g. maximum a posteriori (MAP) decoding, it has the advantage that its complexity is only linear in the code size due to the sparseness of the graph, and its performance is in fact excellent in practice. It has been shown that on several communication channels it is possible to construct ensembles of LDPC codes whose performance under BP is very close to the Shannon limit, as described by T. Richardson and R. Urbanke in "*The capacity of low-density parity-check codes under message passing decoding*", IEEE Transactions on Information Theory in 2001, vol. 47, pages 599-618, and by T. Richardson, M. Shokrollahi and R. Urbanke in "*Design of capacity-approaching irregular low-density parity-check codes*", IEEE Transactions on Information Theory, 2001, vol. 47, pages 619-637.

Among the many possible methods to construct LDPC codes, a powerful approach is the use of so-called protograph codes, which was introduced by J. Thorpe, in "*Low-Density Parity-Check (LDPC) Codes Constructed from Protographs*", IPN Progress Report 42-154, Aug. 15, 2003. Thorpe's procedure consists in the extension of a usually small template graph called "protograph" by the following 2-step copy-and-permute operation:

1. Replicate the protograph q times, and
2. permute the endpoints of the edges to interconnect the replicas.

After the first step, for each node of the protograph, q homologous nodes are obtained. With the second step, the endpoints of the edges are permuted within each class of homologous nodes. This construction, which is known in graph theory as "lifting", guarantees that the asymptotic (i.e. for unconstrained code length) error correction capability of the LDPC ensemble, which is often called the ensemble threshold, is completely determined by the protograph alone.

In its original formulation, the BP algorithm is implemented according to a two-phase flooding schedule: At each iteration, during the first phase, all variable-to-check messages are computed using the previously generated check-to-variable messages and, during the second phase, all check-to-variable messages are computed using the previously generated variable-to-check messages. Despite the theoretical importance of this schedule, in practice, the simultaneous computation and propagation of all messages does not result into the best possible error correction capability for a given number of decoding iterations.

Instead, is well-known in the art that sequential schedules can outperform the flooding schedule, because at every node they use the latest available incoming messages to compute the new outgoing messages. For this reason, sequential schedules are generally preferred in the art. However, to allow an at least partially parallel implementation of the sequential schedule, special LDPC constructions were proposed in which the parity-check matrix has a block structure with constituent sub-matrices that are either permutation matrices of size q×q or zero matrices. Since a permutation matrix has only one "1" per column and per row, each of the q nodes (variables or checks) involved in the permutation is hence connected to exactly one other node (check or, respectively, variable) in the same permutation group. This implies that no two variables (checks) can contribute to the update of the same check (respectively, variable) and therefore all the q variables (checks) in the permutation group can be processed simultaneously without giving up the sequential schedule. The size q of the constituent permutation sub-matrices corresponds to the maximum degree of parallelism of the still strictly sequential schedule. A particularly hardware-friendly implementation is obtained if the permutation matrices are restricted to represent cyclic permutations. The resulting LDPC codes are dubbed quasi-cyclic (QC) and have been studied, e.g. by M. Fossorier in "*Quasi-cyclic low-density parity-check codes from circulant permutation* matrices", *IEEE Transactions on Information Theory* in 2004, vol. 50, pages 1788-1793.

Several sequential schedules have been described in the literature. A first group is based on sequences of check-node updates: at each round, a group of q independent check-to-variable messages is computed and used to update the probabilities of the variable nodes. Some variants of this approach were described e.g. by E. Yeo, P. Pakzad, B. Nikolic and V. Anantharam in *"High-throughput low-density parity-check decoder architectures"*, proceedings of the 2001 *Global Conference on Communications*, San Antonio, Tex., pages 3019-3024, November 2001, and by M. Mansour and N. Shanbhag in *"High-throughput LDPC decoders"*, *IEEE Transactions on Very Large Scale Integration (VLSI) Systems*, vol. 11, no. 6, pp. 976-996, December 2003, and by D. E. Hocevar in *"A reduced complexity decoder architecture via layered decoding of LDPC codes"*, proceedings of the *IEEE Workshop on Signal Processing Systems (SIPS)*, *pages 107-112, 2004*.

Another type of sequential schedules is based on variable-node updates. At each round a group of q independent variable-to-check messages is computed and used to update the probabilities of the check nodes. This approach has been described e.g. by J. Zhang and M. Fossorier in *"Shuffled belief propagation decoding"*, published on conference record of the *Thirty-Sixth Asilomar Conference on Signals, Systems and Computers*, pages 8-15, 2002.

In information theory, the rate of an error correcting code denotes the proportion of information bits to the total number of bits, including redundant bits. The code rate is related to the "code overhead", which is the more common term in the optical community and denotes the proportion of redundant bits to information bits. Namely, if the code generates n bits for every k information bits, its rate is R=k/n, and its overhead is OH=(n−k)/k=1/R−1.

In several communication systems the codec is required to support multiple code rates, e.g. to adapt to the actual channel conditions or to implement hybrid automatic repeat request (HARQ). For this purpose, families of rate-compatible codes have been developed, which can all be encoded and decoded by a single engine. The most common solution consists in puncturing a mother code as described by J. Hagenauer for the case of convolutional codes in *"Rate-compatible punctured convolutional codes (RCPC codes) and their applications"*, *IEEE Transactions on Communications*, volume 36, number 4, pages 389-400, April 1988.

In the article *"The Design of Rate-Compatible Protograph LDPC Codes"*, *IEEE Transactions on Communications*, vol. 60, no. 10, pp. 2841-2850, October 2012, T. V. Nguyen, A. Nosratinia, and D. Divsalar introduce an alternative solution specifically conceived for LDPC codes. According to their approach, a family of rate-compatible LDPC codes is constructed by extending the parity-check matrix of a base high-rate LDPC code by the same number of rows and columns in several subsequent steps.

The evolution of fiber optic communications for core networks puts particularly demanding requirements on the transponders in terms both of sheer throughput and flexibility. In order to achieve optimal performance over a broad range of link and channel configurations, it is advantageous if codec devices support multiple codes with different code rates and error correction capabilities. In G.-H. Gho and J. M. Kahn, "Rate-adaptive modulation and low-density parity-check coding for optical fiber transmission systems", *Journal of Optical Communications and Networking*, Optical Society of America, vol. 4, pp. 760-768, 2012, a possible transmission scheme with adaptive coding and modulation is described. In this publication, the used family of LDPC codes is that specified for the second-generation digital video broadcasting standard for satellite applications (DVB-S2).

Unfortunately, however, the hardware requirements for rate compatible codes which allow for larger overheads, or, in other words, lower code rates, are extremely demanding. In fact, the required processing speed of the decoder increases with overhead and generally makes powerful processors necessary, which increase the hardware costs, the consumption of electrical power and the generation of heat under operation. As a result of that, rate compatible decoders currently employed in optical fiber transmission systems are limited to an overhead of at most 25-30%.

SUMMARY OF THE INVENTION

A goal underlying the present invention is to provide a decoder in combination with a family of rate compatible parity check codes that allows for hardware-efficient decoding even at high overheads. This goal is achieved by a decoder and method according to the present invention, as is further described herein with reference to certain embodiments which are set forth by way of example and without limitation.

According to at least one example embodiment of the invention, a decoder for decoding a family of L rate compatible parity check codes is provided. The family of parity check codes comprises a first code that can be represented by a bipartite graph having variable nodes representing variables, check nodes representing check equations, and edges connecting each check node with two or more variable nodes, and and L−1 codes of increasingly lower code rate, among which the i-th code can be represented by a bipartite graph corresponding to the bipartite graph representing the (i−1)-th code, to which an equal number of $n_i$ variable nodes and check nodes are added. Herein, the added check nodes are connected via edges with selected ones of the variable nodes included in said i-th code, while the added variable nodes are connected via edges with selected added check nodes only, or in other words, not with check nodes that were already present in the (i−1)-th code.

Moreover, the decoder comprises L check node processing units, among which the i-th check node processing unit processes only the check nodes added in the i-th code over the (i−1)-th code, wherein said processing of a check node comprises exchanging messages along the edges of the bipartite graph connected with the check node, and said messages represent the probability that the corresponding variable is 0 or 1. The L check node processing units are configured to operate in parallel. For example, the check node processing units could be resembled by separated blocks within the same ASIC, but the invention is not limited to any particular realization in hardware, as long as the check node processing units are capable of operating in parallel.

Note that due to the multiple check node processing units operating in parallel, the concept of sequential belief propagation (BP) is dispensed with. While according to the general belief in the art, sequential BP schedules are preferable over parallel schedules, because they use at any stage the latest available information to compute the new messages, the specific combination of code and decoder architecture of the present invention does in fact allow for a very high performance, and a much more favorable use of hardware resources than known in the prior art. Surprisingly, although the proposed algorithm is not sequential, it attains in practice essentially the same performance of sequential algorithms due to an interplay of several reasons. Firstly, it builds upon the error correcting capability of the code with the lowest overhead, for which it effectively applies a sequential schedule; secondly, thanks to the parallel processing in the check node processing units, it enhances the information exchange among the groups of check nodes added during the various stages of constructing the members of the code family, or in other words, the information exchange among the "bands" of the corresponding adjacency matrix defined in more detail below; and lastly, it allows for easily optimizing the resource usage, as will become more apparent from the specific example below.

On the other hand, in contrast to purely parallel schedules, as the two-phase flooding schedule, the proposed architecture allows a convenient routing of the BP messages and circumvents the congestion problem in message passing decoders.

Note that contrary to the invention, the available sequential schedules referred to above were not conceived to decode rate-compatible codes obtained by successive extensions. Higher-overhead codes have more variables and checks to be processed, but with the prior art codes and decoding schedules only allow the same maximum degree of parallelism q as all other codes of the family, where q coincides again with the size of the permutation sub-matrices. Consequently, to attain the required throughput, the speed of a prior art sequential decoding engine must grow with the code overhead.

A first disadvantage of this is that the engine must be dimensioned for the processing speed of the highest-overhead code. This implies that the maximum feasible code overhead is limited by complexity constraints and, in practice, it is difficult to implement large-overhead codes for high-throughput applications.

A further disadvantage is that the implementation of families including high-overhead codes requires large permutation sub-matrices to allow a high degree of parallelism and, therefore, results into long codes, large latency, and complex routing of the BP messages. Finally, the extension of an already designed code family with a new higher-overhead code (for instance for a next-generation product) is difficult, because the maximum degree of parallelism q is no longer a free design parameter and the increase of the gross throughput must be entirely attained by an enhancement of the processing speed. Surprisingly, all of these problems can be overcome with the specific combination of the structure of the code family and the decoder of the invention.

In a preferred embodiment, the i-th check node processing unit is configured for processing in parallel subgroups of $q_i$ check nodes among the check nodes added in the i-th code over the a (i−1)-th code. Note that check nodes added within the same code extension, or in other words, check nodes within the same "band" of the adjacency matrix, can in principle be processed sequentially, because they are processed by the same check node processing unit. As described above, the parity-check matrix underlying the code of the invention may have a block structure with constituent sub-matrices that are either permutation matrices of size q×q or zero matrices, which allows for processing up to q check nodes in parallel without giving up the sequential schedule. Accordingly, $q_i$ could correspond to q or could be a number that divides q and still allow for a sequential processing.

In a preferred embodiment, the size $q_i$ of said subgroups processed in parallel differs among the check node processing units. In other words, the degree of parallelism can be individually chosen for different check node processing units, to thereby optimize the use of hardware resources. For example, by choosing a smaller size $q_i$ of the subgroup, a smaller processor may be employed because it only needs to process a smaller number of nodes in parallel. Accordingly, while the present invention requires the use of several check node processing units, the hardware requirements to be met by the individual check node processing units may not be exceedingly high, and this may be in particular true if $q_i$ is chosen sufficiently low. Moreover, by choosing the degree of parallelism individually for each check node processing unit, an ideal scheduling can be obtained, for example ensuring that within the different check node processing units, all the check nodes are processed an equal number of times in the same or at least nearly the same period of time.

In a particularly preferable embodiment, among the check node processing units, for at least one pair i, j the following inequality holds: $q_i < q_j$ for i>j, where i=2, 3, ... L and j=1, 2, ... L−1. In other words, according to this embodiment, at least one of the higher order processing units (e.g. the i-th check node processing unit) operates with a lesser degree of parallelism $q_i$ than one of the lower order processing units (e.g. the j-th check node processing unit). This means that the higher order check node processing unit, which is only operated for correspondingly high extensions of the rate adaptable code, only needs to be configured for comparatively low degrees of parallelism, and may hence have only moderate hardware requirements, which is advantageous for a processing unit that is only occasionally used, namely when codes with higher overhead need to be decoded.

In a preferred embodiment, the rate compatible decoder further comprises a storage for storing, for each variable node, information related to the probability that the variable is 0 or 1.

Preferably, each check node processing unit is configured to receive, for each check node to be processed, a priori probabilities related to the variable nodes connected with said check node to be processed, and to compute updated variable probabilities according to the associated check equation.

Moreover, the rate compatible decoder preferably comprises a combiner for combining updated variable probabilities for the same variable nodes determined in parallel by different check node processing units.

In a preferred embodiment, the family of parity check codes can be represented by an adjacency matrix, of which the columns represent variable nodes, the rows represent check nodes and an entry of "1" represents an edge connecting the variable node and the check node of the corresponding column and row, respectively. Herein, the adjacency matrix is composed of q×q sub-matrices, wherein said q×q sub-matrices are either permutation matrices or zero matrices. As was explained above, this structure allows for processing up to q check nodes added within the same code extension without giving up a sequential schedule among this part of the processing.

In a preferred embodiment, the size q of said sub matrices is an integer multiple of the number $q_i$ of subgroups of check nodes processed in parallel by the i-th node processing unit, and wherein the subgroups of check nodes processed in parallel belong to a same row of q×q sub matrices.

In a preferred embodiment, the code rate of the L-th code is 60% or less, preferably 55% or less, and more preferably 50% or less. Such low code rates, or in other words, such high code overheads, are very difficult to handle with prior art decoders, but can well be achieved with the decoder and decoding method of the invention.

Preferably, the average number of edges connected to the check nodes added in the L-th code and/or the average number of edges connected to the check nodes added in the (L−1)-th code is/are less than the average number of edges connected to the check nodes of the first code. In other words, one or both of the second highest extensions of the code are extensions with comparatively few edges connected to the added check nodes, which means that the computational effort to be carried out by the corresponding highest and/or second highest order check node processing units is comparatively mild.

In a preferred embodiment, the decoder is used for decoding data signals transmitted by optical data transmission. Since fiber optic communications are characterized by very high data rates, the implementation of decoders for rate compatible codes is particularly difficult, and the benefit provided by the invention is particularly high.

DESCRIPTION OF THE PREFERRED EMBODIMENT

For the purposes of promoting an understanding of the principles of the invention, reference will now be made to a preferred embodiment illustrated in the drawings, and specific language will be used to describe the same. It will nevertheless be understood that no limitation of the scope of the invention is thereby intended, such alterations and further modifications in the illustrated apparatus and such further applications of the principles of the invention as illustrated therein being contemplated as would normally occur now or in the future to one skilled in the art to which the invention relates.

Various embodiments of the invention relate to a decoder and a coding schedule for decoding a family of L rate compatible parity check codes. The family of parity check codes comprises a first code that can be represented by a bipartite graph having variable nodes representing variables, check nodes representing check equations, and edges connecting each check node with two or more variable nodes. The family of parity check codes further comprises L−1 codes of increasingly lower code rate, among which the i-th code can be represented by a bipartite graph corresponding to the bipartite graph representing the (i−1)-th code, to which an equal number of $n_i$ variable nodes and check nodes are added. Herein, the added check nodes are connected via edges with selected ones of the variable nodes included in said i-th code, i.e. variable nodes that were added in the generation of the i-th code or variable nodes that were already present in any of the precursor codes, while the added variable nodes are connected via edges with selected added check nodes only, i.e check nodes that were not present in the (i−1)-th code.

Figure 2:
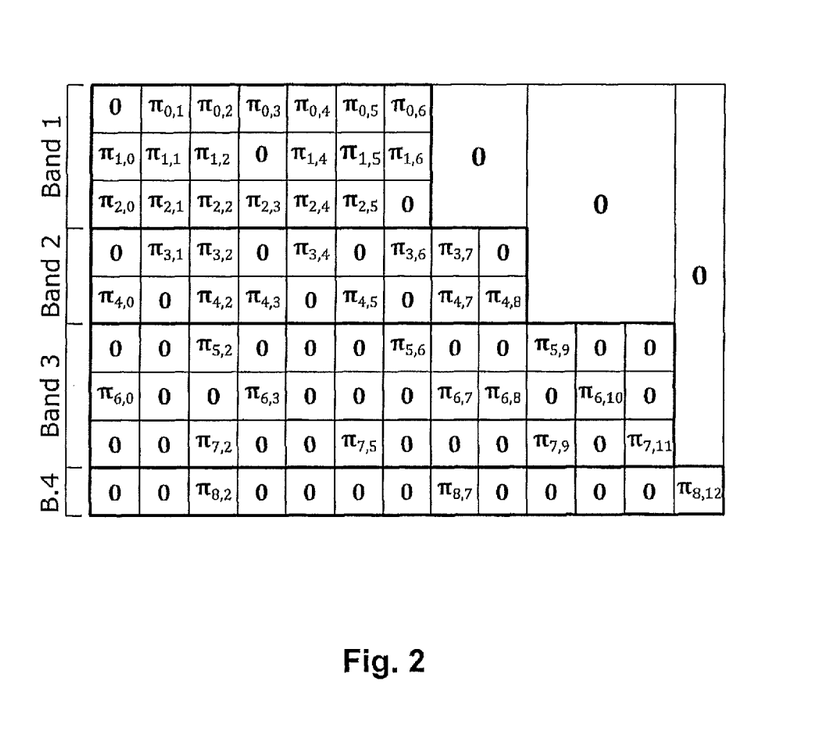
FIG. 2 shows an adjacency matrix for the fourth code out of a family of codes with increasingly lower code rates.

To better illustrate the structure of the family of parity check codes to be decoded with the decoder of the invention, in FIG. 2, a corresponding adjacency matrix or parity matrix is shown for the fourth or lowest rate code of a family consisting of L=4 codes of increasingly lower code rate. Again, the columns of the adjacency matrix represent variable nodes, while the rows represent check nodes. The matrix consists of 9×13 blocks or sub-matrices of size q×q. Included in this matrix of 9×13 blocks is, in the upper left corner, a matrix of 3×7 blocks which represents the adjacency matrix of the first code in the family of codes. The second code in the family of codes is obtained by extending the first code by $n_2=2 \cdot q$ variable nodes and check nodes, such that the matrix representing the second code consists of 5×9 blocks. This 5×9 block matrix is likewise included in the matrix of FIG. 2. Note that upon extending the 3×7 block matrix to the 5×9 block matrix, in the first three block rows of the new block columns only zero-matrices are added, which means that the added variable nodes are indeed connected with the added check nodes only, but not with the check nodes that were already included in the first code. However, the added check nodes may be connected via edges with both the added variable nodes and the variable nodes that were already included in the first code.

Similarly, the adjacency matrix corresponding to the third code within the family of codes can be obtained by extending the adjacency matrix of the second code by $n_3=3 \cdot q$ variable nodes and check nodes, such that the matrix representing the third code consists of 8×12 blocks, and the adjacency matrix corresponding to the fourth code within the family, as shown in FIG. 2 is then obtained by extending the adjacency matrix of the third code by $n_4=q$ variable nodes and check nodes, such that the matrix representing the fourth code acquires the size of 9×13 blocks as shown in FIG. 2.

As illustrated in FIG. 2, the parity-check or adjacency matrices of a family of L rate-compatible LDPC codes obtained by successive extensions can be naturally decomposed in L horizontal bands corresponding to groups of $n_i$ check-nodes that were added upon generating the i-th code from the (i−1)-th code. Decoding the first or highest-rate code is hence tantamount to processing the top band alone, and decoding the i-th code (i=1, 2, . . . , L) of the family means processing the first (from the top) i bands of check-variables.

As is further seen in FIG. 2, each parity-check matrix of the code family has a block structure and its constituent q×q sub-matrices are either permutation matrices or zero matrices. This induces a finer partition of each band in rows of sub-matrices or, shortly, "block rows" that are q bits wide. In the same way, q-bit wide "block columns" are naturally induced. A matrix with such a block structure can be obtained for instance from a protograph adjacency matrix via the lifting procedure described in the introductory portion of the specification.

We denote by $m_l$ the number of block rows in the l-th band (l=1, 2, . . . , L). In the example of FIG. 2, L equals 4 and the bands consist of $m_1=3$, $m_2=2$, $m_3=3$, and $m_4=1$ block rows, respectively. Due to the structure of the parity-check matrices, the maximum degree of parallelism for sequential processing within each band is q. The proposed decoder processes at each round $q_l$ independent check nodes within the l-th band (l=1, 2, ..., L), where $q_l$ divides q. Consequently, processing a block row of the l-th band takes $p_l=q/q_l$ rounds and processing once the whole l-th band takes $p_l \cdot m_l$ rounds.

To decode the i-th code (i=1, 2, ..., L), the decoder of the invention processes the first i bands simultaneously. Since, in general, check nodes belonging to different block rows are not independent, and since according to the invention block rows of different bands are simultaneously processed, the algorithm does not implement a sequential schedule. Instead, the schedule is sequential only within the individual bands, which is why it may be referred to as "bandsequential" herein.

Further, the l-th band (l=1, 2, ..., L) is processed a maximum number $N_{i,l}$ of times, which may depend on the code index i. If all check equations are satisfied, the whole decoding algorithm is possibly stopped, which reduces the number of effectively performed decoding steps. If the stopping criterion is not met, the whole decoding process for the i-th code takes $R_i=\max(N_{i,l} \cdot p_l \cdot m_l)$ rounds to complete. According to this schedule, the i bands are processed independently at different paces and the classic concept of decoding iterations is not applicable.

Figure 3:
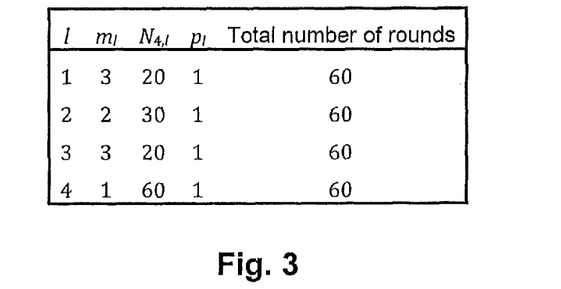
FIG. 3 shows a table of schedule parameters for the same family of rate compatible LDPC codes as shown in FIG. 2.
Figure 4:
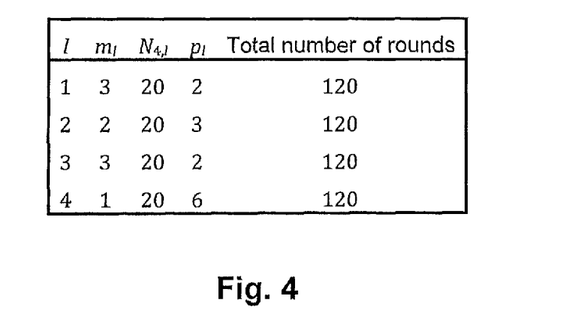
FIG. 4 shows a table of alternative schedule parameters for the same family of rate compatible LDPC codes as shown in FIG. 2.

In the preferred implementation all bands require the same processing time, i.e. $N_{i,l} \cdot p_l \cdot m_l$ is independent of l. This condition ensures full-time utilization of all processing resources and avoids idle cycles. Within the framework of the proposed schedule this can be achieved through multiple choices of the design parameters $p_l$ and $N_{i,l}$. With reference to the fourth code of the family as shown in FIG. 2, a first possible choice is described in the table of FIG. 3: In this case, the degree of parallelism is constant for all bands and the check nodes in the four bands are processed different numbers of times. A second possibility is illustrated in the table of FIG. 4: Here each band uses its individual degree of parallelism and all check nodes are processed an equal number of times. The two solutions correspond to different trade-offs between performance and complexity.

Figure 5:
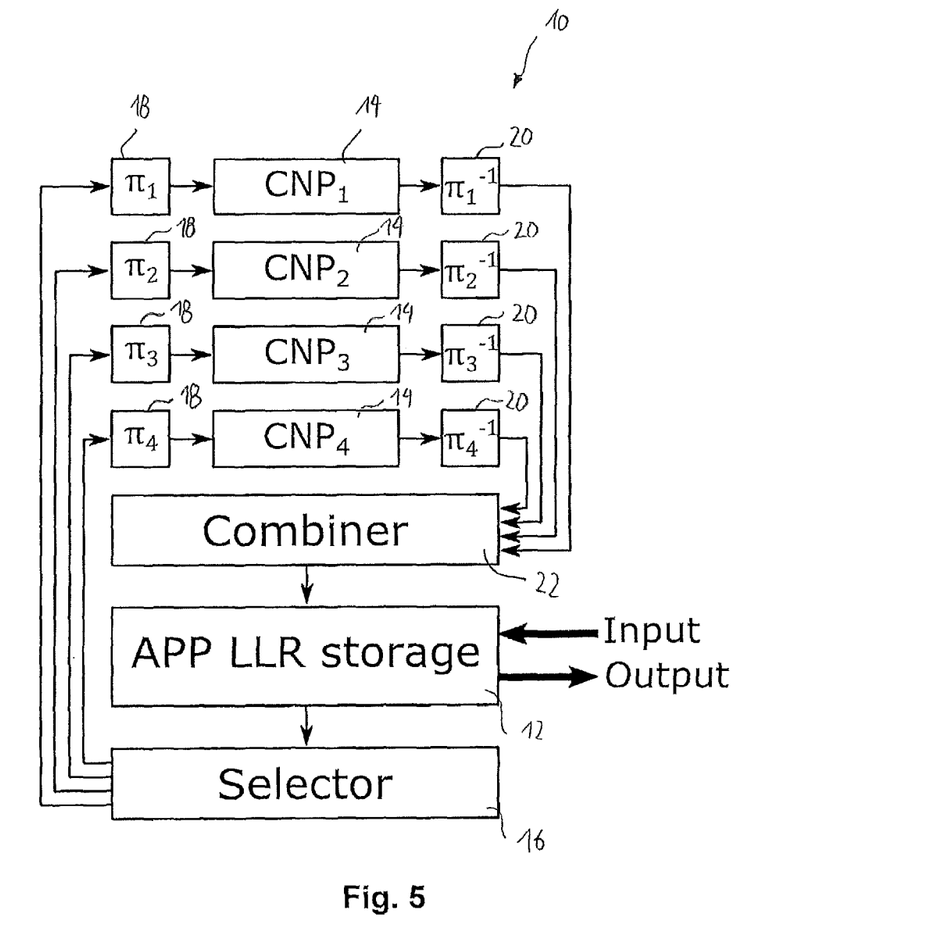
FIG. 5 shows a schematic diagram of a rate compatible decoder for decoding a family of four parity check codes.

FIG. 5 illustrates the architecture of a decoder 10 for a family of four rate-compatible codes according to an embodiment of the invention. The probabilities that the variables (bits) are 0 or 1 are preferably expressed as log-likelihood ratios (LLRs), as described by J. Hagenauer, E. Offer and L. Papke in "*Iterative decoding of binary block and convolutional codes*", IEEE Transactions on Information Theory, vol. 42, pages 429-445, 1996.

The LLRs corresponding to a posteriori probabilities (APP) are stored in a central memory 12. The channel values of all variables represent the input to the algorithm and are used at the beginning of the decoding process to initialize the central storage or memory 12. At each round the APP LLRs are updated according to the BP algorithm and therefore take into account the code constraints corresponding to progressively larger portions of the bipartite graph. After a predefined maximum number of rounds, or as soon as all check equations are satisfied, the decoding process is terminated and the content of the storage, conveying the final estimated probability that each bit is 0 or 1, is outputted.

The LLR updates are computed as check-to-variable messages by suitable check-node processors (CNPs) 14. The number of CNPs 14 is equal to the number of members of the considered code family or, equivalently, the number of bands in the overall parity-check or adjacency matrix. To process the code with the i-th lowest overhead (consisting of the topmost i bands in the parity-check matrix of FIG. 2) only i CNPs are used, while the other CNPs remain idle to save power. Hence, the effective degree of parallelism grows with the code overhead and with the number of check nodes, whereas the speed of the individual processors remains constant.

For each check-variable pair the CNPs 14 keep track of the last computed check-to-variable message. During the initialization phase, all check-to-variable messages are reset. At each round the stored check-to-variable messages are used to "extrinsicate" the APP-LLRs, as described below.

As further shown in FIG. 5, a selector block 16 is provided which forwards to each CNP 14 the APP-LLRs corresponding to the subset of block columns involved in the processed block row. Before entering the l-th CNP 14, the APP LLRs are permuted by a $\pi_l$ permutation block 18 according to the respective permutation sub-matrices of the parity check matrix. Within the CNP block 14, when processing check c, the APP LLR of each involved variable v is diminished of the check-to-node message from c to v, which was previously computed and stored in the CNP 14. This operation is known in the literature as "extrinsication" and serves to avoid recirculating the input information. The output of the CNP 14 is the set of incremental messages from the $q_l$ processed checks to each of the involved variables and represents the additional information gained at the current round. This set of messages can be computed for example according to any of the methods described by X.-Y. Hu, E. Eleftheriou, D.-M. Arnold and A. Dholakia in "*Efficient implementations of the sum product algorithm for decoding LDPC codes*", IEEE Global Telecommunications Conference, GLOBECOM '01, 2001. The output of the l-th CNP 14 undergoes the inverse permutation $\pi_l^{-1}$ in an inverse permutation block 20, which restores the original order. The check-to-node messages produced simultaneously by the CNPs 14 are combined in a combiner block 22, which combination amounts to a summation according to the LLR arithmetic, and added to the APP LLRs in the central memory 12.

Figure 6:
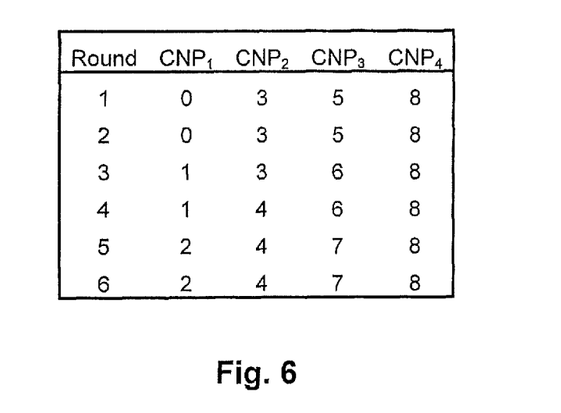
FIG. 6 shows a table summarizing the block rows processed by each of the check node processing units of the decoder of FIG. 5 in the first six operation rounds.

For illustration purposes, the decoding of the 4-th code of the family illustrated in FIG. 2 according to the schedule of FIG. 4 shall be considered. The table shown in FIG. 6 reports the index of the block row processed by each CNP 14 during the first 6 rounds of the schedule. During rounds 1 and 2, $CNP_1$ among the set of CNPs 14 processes the block row 0 of the parity-check matrix. The selector 16 forwards the APP LLRs of the variables in the block columns 1, 2, 3, 4, 5, 6 to the permutation block $\pi_1$, which applies the permutations $\pi_{0,1}, \pi_{0,2}, \pi_{0,3}, \pi_{0,4}, \pi_{0,5}, \pi_{0,6}$ to each LLR block, respectively. The check-to-variable messages produced by $CNP_1$ are subject to the inverse permutations $\pi_{0,1}^{-1}, \pi_{0,2}^{-1}, \pi_{0,3}^{-1}, \pi_{0,4}^{-1}, \pi_{0,5}^{-1}, \pi_{0,6}^{-1}$ before reaching the combiner. The other bands are processed in a similar way. For example, the $CNP_4$ processes the block row 8 during the whole duration of rounds 1-6. The indices of the involved block columns are 2, 7 and 12 and the corresponding permutations are $\pi_{8,2}, \pi_{8,7}, \pi_{8,12}$. The described sequence of 6 rounds can be repeated until the desired decoding performance is achieved.

The messages computed by each CNP 14 apply to distinct variable nodes. However, the messages computed by different CNPs may refer to the same set of variables and therefore must be summed in the combiner block 22 before being stored in the APP LLR storage.

In the example of FIG. 2, the density, i.e. the proportion of non-zero entries in the parity-check matrix varies strongly over the bands. Since the number of messages computed and exchanged in a BP algorithm is proportional to the number of edges in the bipartite graph, decoding lower-density bands requires less resources. In the shown example, the CNP$_4$ consumes less resources than the CNP$_1$ because it operates on a lower-density region of the parity check matrix and has a higher degree of parallelism (p$_1$=2, p$_4$=6 as per Table 2). Accordingly, with the proposed architecture, in contrast with the standard sequential architectures, the inclusion of a high-overhead code in a given code family can be very cheap in terms of additionally required resources.

The disclosed architecture and the associated schedule are expressly conceived to decode a family of rate-compatible LDPC codes constructed by successive extensions. The decoder 10 comprises several functional units, the CNPs 14 and the permutation blocks 18, 20, that are specialized to process specific regions of the parity-check matrix, which are referred to as "bands" herein. On the one hand, this allows a natural growth of the degree of parallelism with the code overhead; on the other hand the use of specifically tailored decoding devices 10 enables significant complexity savings. In particular, the degree of parallelism and the allocated resources can be individually optimized as a function of the width and the density of each band.

While according to the common wisdom in the art, sequential BP schedules are generally believed to provide a better performance than parallel schedules, because they use at any stage the latest available information to compute the new messages, the present invention contrary to this common wisdom does employ a parallel schedule. Surprisingly, although the proposed algorithm is not sequential, it attains in practice essentially the same performance of sequential algorithms, which is attributed by the inventor to several reasons. Firstly, it builds upon the error correcting capability of the code with the lowest overhead, for which it effectively applies a sequential schedule; secondly, thanks to the parallel CNPs 14, it enhances the information exchange among different bands; and lastly, it optimizes the resource usage. On the other hand, in contrast to purely parallel schedules, as the two-phase flooding schedule, the proposed architecture allows a convenient routing of the BP messages and circumvents the dreaded congestion problem in message passing decoders.

Although a preferred exemplary embodiment is shown and specified in detail in the drawings and the preceding specification, these should be viewed as purely exemplary and not as limiting the invention. It is noted in this regard that only the preferred exemplary embodiment is shown and specified, and all variations and modifications should be protected that presently or in the future lie within the scope of protection of the invention as defined in the claims.

The invention claimed is:
1. A decoder, comprising:
a plurality of L check node processing units configured to decode a family of rate-compatible quasi-cyclic low-density parity check codes, the family of parity check codes comprising a plurality of L codes;
wherein each of the plurality of L check node processing units can be represented as a respective l-th check node processing unit among the plurality of L check node processing units, wherein l is an integer that ranges 1≤l≤L;
wherein each of the plurality of L codes can be represented as a respective i-th code among the plurality of L codes, wherein i is an integer that ranges 1≤i≤L;
wherein each respective i-th code among the plurality of L codes can be represented by a respective bipartite graph that corresponds to the respective i-th code, the respective bipartite graph that corresponds to the respective i-th code comprising;
a plurality of variable nodes for the respective i-th code, each representing a respective variable of at least the respective i-th code, and
a plurality of check nodes for the respective i-th code, each representing a respective check equation of at least the respective i-th code,
wherein each respective check node, among the plurality of check nodes for the respective i-th code, connects with at least a respective one of the plurality of variable nodes for the respective i-th code, each of the at least a respective one of the plurality of variable nodes for the respective i-th code connecting, with the respective check node for the respective i-th code, through a respective edge among a plurality of edges of the bipartite graph corresponding to the respective i-th code;
wherein each of the plurality of L codes has a respective code rate among a plurality of code rates;
wherein a code, among the plurality of L codes, having a highest code rate among the plurality of code rates can be represented as the respective i-th code, among the plurality of L codes, for which i=1;
wherein in relation to each respective i-th code among the plurality of L codes for which 2≤i≤L:
the respective i-th code among the plurality of L codes has a lower code rate than a respective (i−1)-th code among the plurality of L codes, and
the plurality of variable nodes for the respective i-th code, in relation to the i-th bipartite graph corresponding to the respective i-th code, comprises:
a plurality of variable nodes of a bipartite graph corresponding to a respective (i−1)-th code among the plurality of L codes, and
a plurality of additional variable nodes for the respective i-th code, wherein a count of the plurality of additional variable nodes for the respective i-th code is equal to n$_i$;
the plurality of check nodes for the respective i-th code, in relation to the i-th bipartite graph corresponding to the respective i-th code, comprises:
a plurality of check nodes of the bipartite graph corresponding to the respective (i−1)-th code among the plurality of L codes, and
a plurality of additional check nodes for the respective i-th code, wherein a count of the plurality of additional check nodes for the respective i-th code is equal to n$_i$;
each of the respective plurality of additional check nodes for the respective i-th code is, in relation to the i-th bipartite graph corresponding to the respective i-th code, connected with at least a respective one of the plurality of variable nodes for the respective i-th code, and
each of the respective plurality of additional variable nodes for the respective i-th code is, in relation to the i-th bipartite graph corresponding to the respective i-th code, connected with at least one of the plurality of check nodes for the respective i-th code but is not connected with any of the plurality of check nodes for the respective i-th code other than one or more of the plurality of additional check nodes for the respective i-th code;
wherein in relation to each respective l-th check node processing unit, among the plurality of L check node processing units, for which l ranges 2≤l≤L and wherein i=l, the respective l-th check node processing unit is configured to:

process, to the exclusion of the plurality of check nodes for the respective (i−1)-th code, the plurality of additional check nodes for the respective i-th code, wherein the processing for which the respective l-th check node processing unit is configured comprises exchanging at least one message along a bipartite graph edge that, in relation to the i-th bipartite graph corresponding to the respective i-th code, connects a one of the plurality of variable nodes for the respective i-th code with a one of the plurality of additional check nodes for the respective i-th code, and process in parallel a plurality of check node subgroups for the respective i-th code, wherein:

a number of the plurality of check node subgroups for the respective i-th code is equal to $q_l$, each of the plurality of check node subgroups for the respective i-th code comprises at least one respective check node among the plurality of additional check nodes for the respective i-th code, wherein none of the at least one respective check node of any given one of the plurality of check node subgroups for the respective i-th code is among the at least one respective check node of which any other of the plurality of check node subgroups for the respective i-th code is comprised;

wherein, in relation to at least a first l-th check node processing unit among the plurality of L check node processing units for which l ranges 2≤l≤L and a second l-th check node processing unit among the plurality of L check node processing units for which l ranges 2≤l≤L that is not the first l-th check node processing unit, at least one of:

the number $q_l$ of check node subgroups the first l-th check node processing unit is configured to process in parallel is a different number than the number $q_l$ of check node subgroups the second l-th check node processing unit is configured to process in parallel, the first l-th check node processing unit is configured to, upon de-coding the respective i-th code wherein i=l, process a maximum number Ni,l of times the one or more additional check nodes for the respective i-th code, and the second l-th check node processing unit is configured to process a maximum number Ni,l of times the one or more additional check nodes for the respective i-th code wherein i=l, and wherein the maximum number Ni,l of times the first l-th check node processing unit is configured to process the one or more additional check nodes for the respective i-th code is a different number than the maximum number Ni,l of times the second l-th check node processing unit is configured to process the one or more additional check nodes for the respective i-th code.

2. The decoder of claim 1, wherein among the plurality of L check node processing units, for at least one pair l, n the following inequality holds: $q_l < q_n$ for l>n, where l=2, 3, ... L and n=1, 2, ... L−1.

3. The decoder of claim 1, further comprising a storage device configured to store information related to a probability that a bit is 0 or 1.

4. The decoder of claim 3, wherein each respective l-th check node processing unit among the plurality of L check node processing units is configured to:

receive, for each check node to be processed among the plurality of additional check nodes for the respective i-th code, a priori probabilities related to any one or more of the respective plurality of additional variable nodes for the respective i-th code that are connected with the respective check node to be processed, and compute updated variable probabilities according to the respective check equation represented by the respective check node for which the respective a priori probabilities are received.

5. The decoder of claim 4, further comprising a combiner configured to receive the updated variable probabilities from the plurality of L check node processing units and to combine the updated variable probabilities.

6. The decoder of claim 1, wherein the family of parity check codes is represented by an adjacency matrix having a plurality of columns and a plurality of rows, wherein:

the plurality of columns each represent a respective one of a plurality of variable nodes;

the plurality of rows each represent a respective one of a plurality of check nodes; and an entry of "1" located in the adjacency matrix at an intersection of a column of the plurality of columns and a row of the plurality of rows represents an edge connecting a variable node that corresponds to the column of the intersection and a check node that corresponds to the row of the intersection.

7. The decoder of claim 6, wherein the adjacency matrix is composed of q×q sub-matrices, wherein each of the q×q sub-matrices is one of a permutation matrix and a zero matrix.

8. The decoder of claim 7, wherein the dimension q of the q×q sub-matrices is an integer multiple of the number $q_l$ of check node subgroups the respective l-th check node processing unit is configured to process in parallel, and wherein the check node subgroups the respective l-th check node processing unit is configured to process in parallel belong to a same row of q×q sub matrices.

9. The decoder of claim 1, wherein the code rate of the L-th code ≤60%.

10. The decoder of claim 1, wherein an average number of edges connected to the plurality of additional check nodes for the i-th code for i=L is less than an average number of edges connected to the plurality of check nodes for the i-th code for i=1.

11. The decoder of claim 1, wherein the decoder is configured for an optical data transmission system.

12. A method for decoding, comprising the steps of:

processing a family of rate-compatible quasi-cyclic low-density parity check codes using a plurality of L check node processing units, the family of parity check codes comprising a plurality of L codes;

wherein each of the plurality of L check node processing units can be represented as a respective l-th check node processing unit among the plurality of L check node processing units, wherein l is an integer that ranges 1≤l≤L;

wherein each of the plurality of L codes can be represented as a respective i-th code among the plurality of L codes, wherein i is an integer that ranges 1≤i≤L;

wherein each respective i-th code among the plurality of L codes can be represented by a respective bipartite graph that corresponds to the respective i-th code, the respective bipartite graph that corresponds to the respective i-th code comprising;

a plurality of variable nodes for the respective i-th code, each representing a respective variable of at least the respective i-th code, and a plurality of check nodes for the respective i-th code, each representing a respective check equation of at least the respective i-th code, wherein each respective check node, among the plurality of check nodes for the respective i-th code, connects with at least a respective one of the plurality of variable nodes for the respective i-th code, each of the at least a respective one of the plurality of variable nodes for the respective i-th code connecting, with the respective check node for the respective i-th code, through a respective edge among a plurality of edges of the bipartite graph corresponding to the respective i-th code;

wherein each of the plurality of L codes has a respective code rate among a plurality of code rates;

wherein a code, among the plurality of L codes, having a highest code rate among the plurality of code rates can be represented as the respective i-th code, among the plurality of L codes, for which i=1;

wherein in relation to each respective i-th code among the plurality of L codes for which 2≤i≤L:
  the respective i-th code among the plurality of L codes has a lower code rate than a respective (i−1)-th code among the plurality of L codes, and
  the plurality of variable nodes for the respective i-th code, in relation to the i-th bipartite graph corresponding to the respective i-th code, comprises:
    a plurality of variable nodes of a bipartite graph corresponding to a respective (i−1)-th code among the plurality of L codes, and
    a plurality of additional variable nodes for the respective i-th code, wherein a count of the plurality of additional variable nodes for the respective i-th code is equal to $n_i$;
  the plurality of check nodes for the respective i-th code, in relation to the i-th bipartite graph corresponding to the respective i-th code, comprises:
    a plurality of check nodes of the bipartite graph corresponding to the respective (i−1)-th code among the plurality of L codes, and
    a plurality of additional check nodes for the respective i-th code, wherein a count of the plurality of additional check nodes for the respective i-th code is equal to $n_i$;
  each of the respective plurality of additional check nodes for the respective i-th code is, in relation to the i-th bipartite graph corresponding to the respective i-th code, connected with at least a respective one of the plurality of variable nodes for the respective i-th code, and
  each of the respective plurality of additional variable nodes for the respective i-th code is, in relation to the i-th bipartite graph corresponding to the respective i-th code, connected with at least one of the plurality of check nodes for the respective i-th code but is not connected with any of the plurality of check nodes for the respective i-th code other than one or more of the plurality of additional check nodes for the respective i-th code;

wherein in relation to each respective l-th check node processing unit, among the plurality of L check node processing units, for which l ranges 2≤l≤L and wherein i=l, the respective l-th check node processing unit is configured to:
  process, to the exclusion of the plurality of check nodes for the respective (i−1)-th code, the plurality of additional check nodes for the respective i-th code, wherein the processing for which the respective l-th check node processing unit is configured comprises exchanging at least one message along a bipartite graph edge that, in relation to the i-th bipartite graph corresponding to the respective i-th code, connects a one of the plurality of variable nodes for the respective i-th code with a one of the plurality of additional check nodes for the respective i-th code, and
  process in parallel a plurality of check node subgroups for the respective i-th code, wherein:
    a number of the plurality of check node subgroups for the respective i-th code is equal to $q_l$,
    each of the plurality of check node subgroups for the respective i-th code comprises at least one respective check node among the plurality of additional check nodes for the respective i-th code, wherein none of the at least one respective check node of any given one of the plurality of check node subgroups for the respective i-th code is among the at least one respective check node of which any other of the plurality of check node subgroups for the respective i-th code is comprised;

wherein, in relation to at least a first l-th check node processing unit among the plurality of L check node processing units for which l ranges 2≤l≤L and a second l-th check node processing unit among the plurality of L check node processing units for which l ranges 2≤l≤L that is not the first l-th check node processing unit, at least one of:
  the number $q_l$ of check node subgroups the first l-th check node processing unit is configured to process in parallel is a different number than the number $q_l$ of check node subgroups the second l-th check node processing unit is configured to process in parallel,
  the first l-th check node processing unit is configured to, upon de-coding the respective i-th code wherein i=1, process a maximum number Ni,l of times the one or more additional check nodes for the respective i-th code, and the second l-th check node processing unit is configured to process a maximum number Ni,l of times the one or more additional check nodes for the respective i-th code wherein i=l, and wherein the maximum number Ni,l of times the first l-th check node processing unit is configured to process the one or more additional check nodes for the respective i-th code is a different number than the maximum number Ni,l of times the second l-th check node processing unit is configured to process the one or more additional check nodes for the respective i-th code.

13. The method of claim 12, wherein among the plurality of L check node processing units, for at least one pair l, n the following inequality holds: $q_l < q_n$, for l>n, where l=2, 3, . . . L and n=1, 2, . . . L−1.

14. The method of claim 12, further comprising a step of storing information related to a probability that a bit is 0 or 1.

15. The method of claim 14, wherein each respective l-th check node processing unit among the plurality of L check node processing units:
  receives, for each check node to be processed among the plurality of additional check nodes for the respective i-th code, stored a priori probabilities related to any one or more of the respective plurality of additional variable nodes for the respective i-th code that are connected with the respective check node to be processed, and
  computes updated variable probabilities according to the respective check equation represented by the respective check node for which the respective a priori probabilities are received.

16. The method of claim 15, further comprising a step of: combining updated variable probabilities from the plurality of L check node processing units.

17. The method of claim 12, wherein the code rate of the L-th code is 60%.

18. The method of claim 12, wherein an average number of edges connected to the plurality of additional check nodes for the i-th code for i=L is less than an average number of edges connected to the plurality of check nodes for the i-th code for i=1.

19. The method of claim 12, wherein the decoding is carried out by an optical data transmission system.

* * * * *